United States Patent [19]

McIntyre et al.

[11] Patent Number: 4,918,508

[45] Date of Patent: Apr. 17, 1990

[54] VERTICAL PHOTOCONDUCTIVE DETECTOR

[75] Inventors: Robert J. McIntyre, Quebec, Canada; Ramon U. Martinelli, Hightstown, N.J.

[73] Assignee: General Electric Company, Schenectady, N.Y.

[21] Appl. No.: 274,630

[22] Filed: Nov. 18, 1988

Related U.S. Application Data

[63] Continuation of Ser. No. 845,335, Mar. 28, 1986, abandoned.

[51] Int. Cl.[4] .................. H01L 27/14; H01L 29/161; H01L 23/48
[52] U.S. Cl. ........................ 357/30; 357/16; 357/58; 357/67
[58] Field of Search ............... 357/30 B, 30 E, 30 F, 357/30 J, 30 P, 30 L, 30 Q, 16, 89, 58, 30 R, 67

[56] References Cited

U.S. PATENT DOCUMENTS

| | | |
|---|---|---|
| 4,405,915 | 9/1983 | Komatsu et al. |
| 4,462,019 | 7/1984 | Ewaldt et al. |
| 4,490,709 | 12/1984 | Hammond et al. ............... 357/30 B |
| 4,564,720 | 1/1986 | Hogan ............................. 357/30 Q |
| 4,626,675 | 12/1986 | Gündner et al. ................ 357/30 E |

FOREIGN PATENT DOCUMENTS

| | | | |
|---|---|---|---|
| 53-136987 | 11/1978 | Japan | 357/30 F |
| 54-7892 | 1/1979 | Japan | 357/30 F |
| 57-13144 | 3/1982 | Japan | 357/30 F |
| 59-22371 | 2/1984 | Japan | 357/30 F |
| 59-48963 | 3/1984 | Japan | 357/30 E |
| 59-211288 | 11/1984 | Japan | 357/30 K |

OTHER PUBLICATIONS

Agusta et al., "Optical Switching in GaN-Si Switching and Memory Devices", IBM Technical Disclosure Bulletin, vol. 15, No. 7, Dec. 1972.

Lean et al., "Optical Surface Waveguide", IBM Technical Disclosure Bulletin, vol. 15, No. 1, Jun. 1972.

Gammel et al., "A Photoconductive Detector for High-Speed Fiber Communication", IEEE Transactions on Electron Devices, vol. ED-28, No. 7, Jul. 1981, pp. 841–849.

A. Antreasyan et al., "$Ga_{0.47}In_{0.53}As$ Vertical Photoconductive Detectors with High Gain and Low Bias Voltage", IEEE Transactions on Electron Devices, vol. ED-33, No. 2, Feb. 1986, pp. 188–191.

C. Y. Chen et al., "Interdigitated $Al_{0.48}In_{0.52}As/Ga_{0.47}In_{0.53}As$ Photoconductive Detectors", App. Phys. Lett. 44(1), 1 Jan. 1984, pp. 99–101.

C. Y. Chen et al., "High-Speed Junction-Depleted $Ga_{0.47}In_{0.53}As$ Photoconductive Detectors", Appl. Phys. Lett 46(12), 15 Jun. 1985, pp. 1164–1166.

C. Y. Chen et al., "Reduction of Fall Times in $Ga_{0.47}In_{0.53}As$ Photoconductive Receivers Through Back Gating", Appl. Phys. Lett 46(3), 1 Feb. 1985, pp. 296–298.

"Vapour-phase Epitaxy of GaInAsP", by G. H. Olsen, published in GaInAsP Alloy Semiconductors, edited by T. P. Pearsall, 1982, John Wiley & Sons Ltd.

*Primary Examiner*—Andrew J. James
*Assistant Examiner*—Ngan Van Ngo
*Attorney, Agent, or Firm*—Henry I. Steckler; James C. Davis, Jr.; Paul R. Webb, II

[57] ABSTRACT

A photoconductive detector comprises a substrate layer of semiconductor material of a first conductivity type substantially transparent of light at the wavelength to be detected and doped sufficiently to provide ohmic contact to the photoconductive active region overlying said substrate layer. The active region comprises a body of undoped semiconductor material absorptive of light at the wavelength to be detected, having first and second major surfaces. The substrate layer serves as a first ohmic contact for the entire first major surface of the active region and a metal or metal alloy serves as a second ohmic contact overlying the entire second major surface of said active region.

18 Claims, 1 Drawing Sheet

VERTICAL PHOTOCONDUCTIVE DETECTOR

The U.S. Government has rights in this invention pursuant to Contract No. F19628-84-C-0098 awarded by the Department of the Air Force.

This application is a continuation of application Ser. No. 06/845,335, filed Mar. 28, 1986, now abandoned.

This invention relates to a photoconductive detector and more particularly concerns a high speed, high gain detector for use in optical communications systems.

BACKGROUND OF THE INVENTION

A conventional intrinsic photoconductive detector comprises a body of photosensitive material having a pair of spaced bias contacts. Incident radiation, having energy greater than or equal to the bandgap of the photosensitive material, is absorbed and electron-hole pairs are generated resulting in an increase in conductivity.

It is known that the sensitivity of a detector is enhanced by photoconductive gain. Photoconductive gain is typically a result of the difference in the times that electrons and holes spend within the photoconductive materials. For example, the mobility for electrons in InGaAs at room temperature is about 40 times greater than the mobility for holes in that material. When a photon is absorbed and an electron-hole pair is generated, many electrons are injected by the negatively biased contact and traverse the photoconductive material during the time the photogenerated hole exists in that material. The photoconductive gain, therefore, is roughly equal to the number of electrons which cross the photoconductive material for each photon absorbed.

Equally important of the performance of a detector is its bandwidth which effectively is a measure of how fast the device responds, i.e. how many bits of information it can detect per second. The bandwidth is determined by the time that a photogenerated hole spends in the photoconductive material. The longer the time that the hole remains in the photoconductive material, the smaller the bandwidth, i.e. the slower the response of the device.

In the area of high-speed optical communications systems, where data rates are in the gigabit/second range, there has been a significant interest in lateral photoconductors because of their bandwidth and photoconductive gain capabilities. By lateral photoconductor is meant a device wherein light is incident upon a thin layer of photosensitive material in a direction perpendicular to that of the current flow. Also, lateral photoconductors are ideal for monolithic integrated photoreceiver applications because their structures are compatible with those of field-effect transistors.

Since these devices conventionally employ materials with high mobility ratios to realize a higher gain, it becomes necessary to provide a mechanism by which the time the hole spends in the active region is reduced for a larger bandwidth. One approach has been to form a detector comprising a substrate, typically of the N+ conductivity type, and thereover an active region, typically undoped or lightly doped. Anodes and cathodes are interdigitated on the upper surface of the active region and the anode-to-cathode spacing must be sufficiently small to provide that the holes are swept out of the photosensitive area at least as fast as the data rate. However, this means that about 30 to 50 percent of the incident light will be obscured by the interdigitated anodes and cathodes on the detector surface thus, decreasing the incoming signal. Also, with both electrodes on one surface there exists a nonuniform electric field across the photosensitive area which has the unwanted effect of decreasing the bandwidth and creating a spatially non-uniform gain. Further, because much of the incident light is absorbed close to the anodes and cathodes, up to 50 percent of the gain otherwise realizable is lost.

Other efforts to accommodate data rates in the gigabit/second range include variations on the interdigitated approach. For example, one scheme utilizes a reverse biased p-n junction behind the photoconductive layer to remove the holes from the photoconductive material. This device is characterized, however, by reduced gain and increased generation-recombination noise.

Alternatively, some recent efforts have been directed to vertical photoconductors. In FIG. 1 a prior art photoconductive detector 10 comprises a substrate 12 typically of N+ conductivity type, an active region 14 of N− conductivity type and a thin contact window 16 of N+ conductivity type. The thickness of the active region 14 is generally about 2-3 $\mu$m. A ring-shaped metal contact 20 defines an opening 18 through which light enters which is a larger area than in the lateral device. The N+ substrate 12 and N+ contact window 16 serve as ohmic contacts to the active region 14 across its entire width. In theory this should provide uniform vertical fields across the active region 14. In long wavelength (1.0-1.6 $\mu$m) applications the active region 14 is typically of InGaAs and, for considerations relating to noise and resistance levels, the contact window 16 is of the same material. This provides however, that the contact window 16 must be relatively thin, i.e. about 0.5 to 1.0 $\mu$m so that most of the light will not be absorbed by the contact window 16. At these thicknesses, a lateral electric field exists across the contact window 16 and into the active region 14 due to the location of the ring contact 20. Thus, the electron and hole trajectories become lateral and the distances traveled become greater than the active region thickness thereby increasing the gain but greatly reducing the bandwidth. Also, since the substrate 12 is typically of InP, holes traveling towards the substrate 12 may be caught in charge traps known to exist for minority carriers at this InGaAs/InP interface 24. This also results in increased gain but can significantly reduce the bandwidth.

A photoconductive detector suitable for high speed operation with high gain, reduced noise and trapping and straightforward adaptability to monolithic integration had been sought.

SUMMARY OF THE INVENTION

A photoconductive material of a first conductivity type substantially transparent of light at the wavelength to be detected and doped sufficiently to provide ohmic contact to the photoconductive active region overlying said substrate layer. The active region comprises a body of undoped semiconductor material absorptive of light at the wavelength of be detected, having first and second major surfaces. The substrate layer serves as a first ohmic contact for the entire first major surface of the active region and a metal or metal alloy serves as a second ohmic contact overlying the entire second major surface of said active region.

DETAILED DESCRIPTION OF THE PREFERRED EMBODIMENTS

Figure 1:
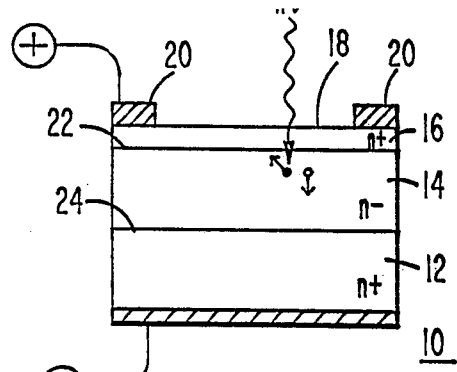
FIG. 1 is a cross section view of a vertical photoconductive detector of the prior art.
Figure 2:
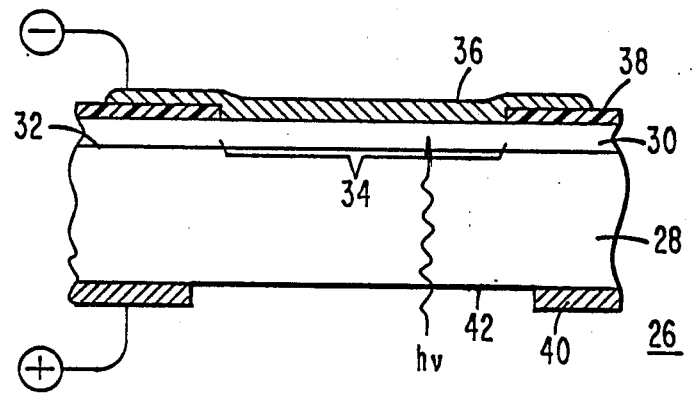
FIG. 2 is a cross section view of a vertical photoconductive detector in accordance with the present invention.

In FIG. 2 an inverted vertical photoconductive detector 26 comprises a substrate layer 28 and photoconductive layer 30, overlying the substrate layer 28 with a heterojunction interface 32 therebetween. An active region 34 comprises that portion of the photoconductive layer 30 across which a bias is applied. The substrate layer 28 serves as a light transmissive first ohmic contact and a second ohmic contact 36 overlies the entire active region 34. The area of the second contact 36 contacting the active region 34 is defined by the dielectric regions 38. A ring-shaped electrical contact 40 defines an opening 42 for the light to enter the substrate 28. This opening 42 is typically on the order of 20 to 30 micrometers in diameter allowing virtually all of the light to enter the substrate layer 28. An antireflection coating, e.g. $Si_3N_4$, SiO, $SiO_2$ may be employed.

The substrate layer 28 is of a first conductivity type and doped sufficiently to provide ohmic contact to the active region 34. Typically, the substrate layer 28 is heavily doped and may have mobile charge carriers in a concentration greater than about $10^{17}/cm^3$ and preferably greater than about $10^{18}/cm^3$. It must be substantially transparent of light at the wavelength to be detected, i.e. transmissive of at least 90 percent and therefore should not be thicker than about 150 $\mu$m. The substrate layer 28 should be at least 5 $\mu$m thick to avoid any lateral fields from the ring contacts 40. The substrate layer 28 is typically of an N+ conductivity type semiconductor such as GaAs or InP, and it may function as the detector substrate or may be a layer over another substrate.

The active region 34 can be defined by a mesa structure of can be that portion of the photoconductive layer 30 across which a bias is applied. In the latter case the amount of the layer 30 contacting the second ohmic contact 36 substantially determines the width of the active region 34. The effective width of the active region 34 may actually be slightly greater than the width of the contact 36 due to a slight amount of spreading of the field (1 or 2 $\mu$m) across the typically 2 to 3 $\mu$m thick region 42. The active region 34 is either intrinsic or may be of the same conductivity type as the substrate layer 28 but is typically undoped or unintentionally lightly doped. The active region 34 should have mobile charge carriers in a concentration of less than about $10^{15}/cm^3$ and preferably in the $10^{14}/cm^3$ range or below. Alternatively, the active region 34 can be doped to increase the resistance in an effort to provide noise reduction. However, this decreases the mobility of the charge carriers in the active region 34. The active region 34 is composed of a photoconductive semiconductor material absorptive of light at the wavelength to be detected. Materials with high mobility ratios, i.e. the ratio of the mobility of majority to minority carriers (electrons/holes in N type material), of between about 10:1 and 20:1 and preferably 40:1 and above are advantageous for use in the active region 34. N— conductivity type materials such as GaAs, InGaAs and the like are well suited for this purpose.

The second ohmic contact 36 is typically a metal alloy which can continuously supply majority carriers to the active region with no voltage drop. For example, in the detector 26 having an N+ InP substrate layer 28 and an N— InGaAs active region 34 gold-tin, gold-germanium and the like are suitable for the material of the second ohmic contact 36. This contact 36 may be deposited in the widths desired for the active region 34 or the contact widths may be conveniently defined by a continuous layer of the second ohmic contact 36 over regions 38 of dielectric material, e.g. silicon dioxide and the like.

The electrical contact means 40 shown as a ring-shape in FIG. 2 can be of any geometric shape or of any conductive material suitable for making a good electrical contact.

It should be apparent that the regions and layers described may be of the opposite conductivity types so long as the relative conductivity types are maintained.

The active region 34 can be deposited over the substrate layer 28 by liquid phase or molecular beam epitaxy, or preferably by vapor phase epitaxy as described for example, by G. H. Olsen in an article entitled, "Vapour-phase Epitaxy of GaInAsP", a chapter from *GaInAsP Alloy Semiconductors*, edited by T. P. Pearsall (John Wiley & Sons, 1982).

During operation, the detector 26 has the advantage over an interdigitated structure of an extremely uniform electric field provided by the first ohmic contact, which is the substrate layer 28, and the second ohmic contact 36 which completely overlie first and second major surfaces, respectively, of the active region 34. In the case of an InGaAs/InP detector, the InP substrate 28 is completely transparent of light of the wavelength to be detected by the InGaAs active region 34 at thicknesses of about 150 $\mu$m or less. Thus, this layer 28 can be sufficiently thick to alleviate any lateral field effect from the electrical contact ring 40, which typically characterize prior art vertical photoconductors. Although the detector functions when biased in either direction, it is preferably biased such that the substrate layer 28 is the anode and the second ohmic contact 36 is the cathode. In this way holes generated near the InP/InGaAs interface travel toward the second ohmic contact/active region interface which is virtually free of charge traps as compared to prior art detectors.

Thus, the gain is much more uniform due to the ease of providing a uniform electric field across the active region by the first and second ohmic contacts with no lateral field effects and minimized light absorption by the substrate layer. Further, the reduced charge trapping of holes at the active region/metallic ohmic contact interface provides bandwidths in the gigabit/second range.

Figure 3:
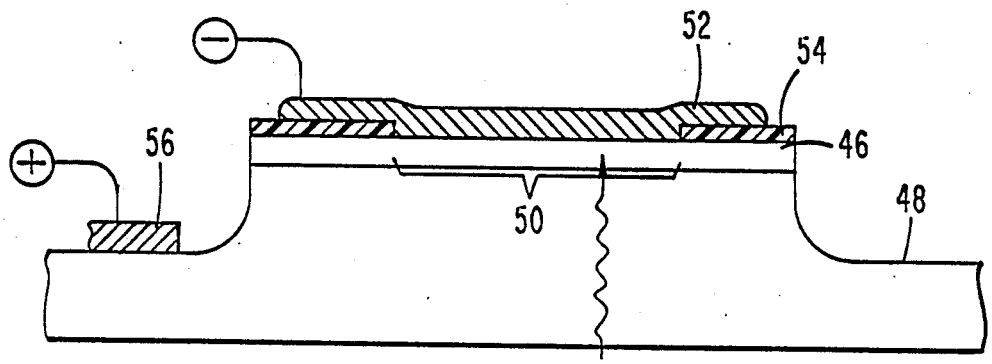
FIG. 3 is a cross section view of a vertical photoconductive detector in accordance with the present invention.

In FIG. 3, a second detector 44 of the invention includes the same basic elements as the detector 26 of FIG. 2. In this detector 44, after the photoconductive layer 46 is formed on the substrate layer 48, a mesa structure is formed by known techniques and the width of the active region 50 is defined by the width of the second ohmic contact 52. The ohmic contact 52 in turn is defined by the dielectric regions 54. The mesa structure provides that the electrical contact means 56, which may be a ring structure, can be on the same side of the detector 44 as the second ohmic contact 52 providing obvious design advantages. Alternatively, the mesa width can define the active region width in which case the second contact should cover the entire mesa surface.

Besides the high gain, uniform field, and gigabit-/second bandwidths mentioned above, the inverted photoconductive detector described herein has the added advantage that its fabrication only entails the growth of one epitaxial layer over the substrate followed by known photolithographic and metallization techniques to form the second ohmic contact. It can be fabricated as a mesa-, or more conveniently, as a planar-structure and is well suited to monolithic integration into photoreceiver applications.

We claim:

1. A vertical photoconductive detector comprising:
   a substrate layer of semiconductor material entirely of a first conductivity type substantially transparent at the wavelength to be detected and doped sufficiently such that a first major surface of said substrate layer serves as a first ohmic contact with;
   an active region of semiconductor material overlying said substrate, and being entirely of said first conductivity type or entirely intrinsic and absorptive of light at the wavelength to be detected, said active region having first and second major surfaces wherein the entire first major surface of said active region is in contact with the substrate layer;
   a second ohmic contact comprising a metal, or metal alloy, overlying the entire second major surface of said active region; and
   means for making electrical contact to said substrate layer.

2. The detector of claim 1 wherein said substrate layer comprises a heavily doped semiconductor material.

3. The detector of claim 2 wherein said substrate layer contains mobile charge carriers in a concentration greater than about $10^{17}$ per cubic centimeter.

4. The detector of claim 3 wherein said substrate layer contains mobile charge carriers in a concentration greater than about $10^{18}$ per cubic centimeter.

5. The detector of claim 1 wherein said substrate layer is of an N type material.

6. The detector of claim 5 wherein said substrate layer is of InP.

7. The detector of claim 1 wherein said active region is of the same conductivity type as said substrate layer.

8. The detector of claim 7 wherein said active region is of a lightly doped material.

9. The detector of claim 8 wherein said active region contains mobile charge carriers in a concentration less than about $10^{15}$ per cubic centimeter.

10. The detector of claim 9 wherein said active region contains mobile charge carriers in a concentration less than or equal to $10^{14}$ per cubic centimeter.

11. The detector of claim 1 wherein said active region comprises a material wherein the majority carriers have a greater mobility than the minority carriers.

12. The detector of claim 11 wherein the ratio of mobilities of majority to minority carriers within the active region is greater than about 10:1.

13. The detector of claim 12 wherein the ratio of mobilities of majority to minority carriers within the active region is about 40:1.

14. The detector of claim 13 wherein said active region comprises InGaAs.

15. The detector of claim 1 wherein said second ohmic contact comprises an alloy selected from the group consisting of gold-tin and gold-germanium.

16. The detector of claim 1 wherein said first ohmic contact is an anode and said second ohmic contact is a cathode.

17. The detector of claim 1 wherein said active region is between about 1 and 3 micrometers thick.

18. The detector of claim 1 wherein said substrate layer is between about 5 and 150 micrometers thick.

* * * * *